(12) United States Patent
Kim

(10) Patent No.: US 11,374,568 B2
(45) Date of Patent: Jun. 28, 2022

(54) SEMICONDUCTOR APPARATUS INCLUDING POWER GATING CIRCUITS

(71) Applicant: SK hynix Inc., Icheon-si (KR)

(72) Inventor: Woongrae Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/141,934

(22) Filed: Jan. 5, 2021

(65) Prior Publication Data
US 2021/0126635 A1 Apr. 29, 2021

Related U.S. Application Data

(63) Continuation of application No. 15/957,423, filed on Apr. 19, 2018, now Pat. No. 10,892,754.

(30) Foreign Application Priority Data

Oct. 12, 2017 (KR) .................. 10-2017-0132778

(51) Int. Cl.
| | |
|---|---|
| *H03K 19/00* | (2006.01) |
| *H03K 17/14* | (2006.01) |
| *H03K 19/0175* | (2006.01) |
| *H03K 19/003* | (2006.01) |
| *H03K 5/135* | (2006.01) |
| *G06F 9/4401* | (2018.01) |
| *G06F 1/26* | (2006.01) |
| *G06F 1/28* | (2006.01) |
| *G06F 1/3287* | (2019.01) |
| *H03K 5/134* | (2014.01) |
| *G06F 1/20* | (2006.01) |
| *G06F 1/10* | (2006.01) |
| *G06F 1/324* | (2019.01) |

(Continued)

(52) U.S. Cl.
CPC .......... *H03K 19/0016* (2013.01); *G06F 1/10* (2013.01); *G06F 1/206* (2013.01); *G06F 1/263* (2013.01); *G06F 1/28* (2013.01); *G06F 1/324* (2013.01); *G06F 1/3287* (2013.01); *G06F 1/3296* (2013.01); *G06F 9/4401* (2013.01); *H03K 5/134* (2014.07); *H03K 5/135* (2013.01); *H03K 17/145* (2013.01); *H03K 19/00369* (2013.01); *H03K 19/017545* (2013.01); *H03K 2005/00019* (2013.01); *H03K 2005/00195* (2013.01)

(58) Field of Classification Search
CPC ........ G06F 1/26; G06F 1/3206; G06F 1/3287; G06F 1/10; G06F 1/206; G06F 1/263; G06F 1/28; G06F 1/324; G06F 1/3296; G06F 9/4401; H03K 19/0016; H03K 5/134; H03K 5/135; H03K 17/145; H03K 19/00369; H03K 19/017545; H03K 2005/00019; H03K 2005/00195
USPC .......................................... 713/300; 323/318
See application file for complete search history.

(56) References Cited

U.S. PATENT DOCUMENTS

| | | | |
|---|---|---|---|
| 5,996,083 A | 11/1999 | Gupta et al. | |
| 7,276,932 B2 * | 10/2007 | Kuang | H03K 19/0016 326/33 |
| 7,444,525 B2 | 10/2008 | Yoshihara et al. | |

(Continued)

*Primary Examiner* — Ji H Bae
(74) *Attorney, Agent, or Firm* — William Park & Associates Ltd.

(57) ABSTRACT

A semiconductor apparatus may include logic circuits and a control logic. The control logic may be configured to monitor characteristics of the logic circuits to allow the semiconductor apparatus to perform at different operating speeds.

10 Claims, 4 Drawing Sheets

(51) Int. Cl.
  *G06F 1/3296* (2019.01)
  *H03K 5/00* (2006.01)

(56) References Cited

U.S. PATENT DOCUMENTS

| | | | | |
|---|---|---|---|---|
| 8,456,199 | B2* | 6/2013 | Yeung | G06F 30/00 |
| | | | | 327/108 |
| 8,648,654 | B1* | 2/2014 | Myers | H03K 19/0016 |
| | | | | 327/565 |
| 9,804,650 | B2* | 10/2017 | Patil | G06F 1/266 |
| 2010/0322016 | A1* | 12/2010 | Kumar | G11C 7/02 |
| | | | | 365/189.07 |
| 2011/0102072 | A1* | 5/2011 | Idgunji | H03K 19/0005 |
| | | | | 327/540 |
| 2012/0079480 | A1 | 3/2012 | Liu | |
| 2014/0097702 | A1 | 4/2014 | Upputuri et al. | |
| 2015/0082070 | A1* | 3/2015 | Bose | G06F 1/3287 |
| | | | | 713/324 |
| 2015/0162898 | A1 | 6/2015 | Bose et al. | |
| 2016/0284390 | A1* | 9/2016 | Tomishima | G11C 11/4093 |
| 2016/0349827 | A1* | 12/2016 | Idgunji | G06F 1/3287 |
| 2017/0024000 | A1* | 1/2017 | Chen | G06F 1/3243 |
| 2019/0088760 | A1* | 3/2019 | Lee | H01L 29/6684 |

* cited by examiner

FIG.4
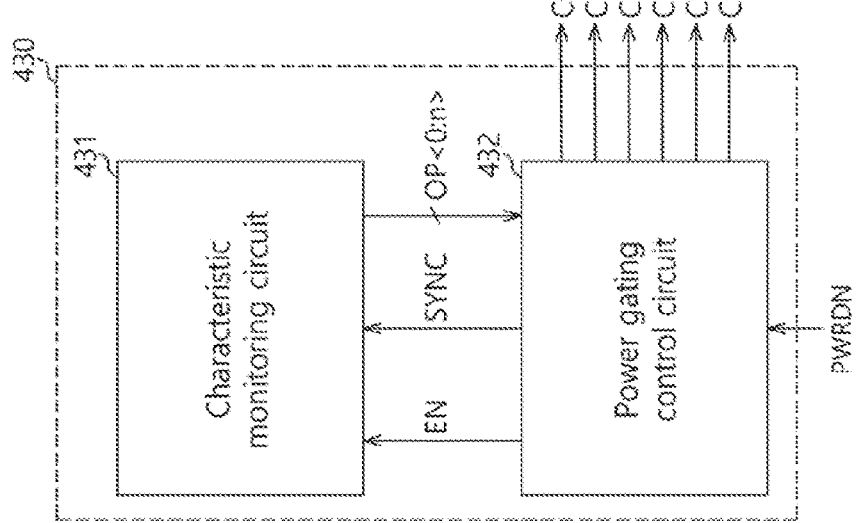
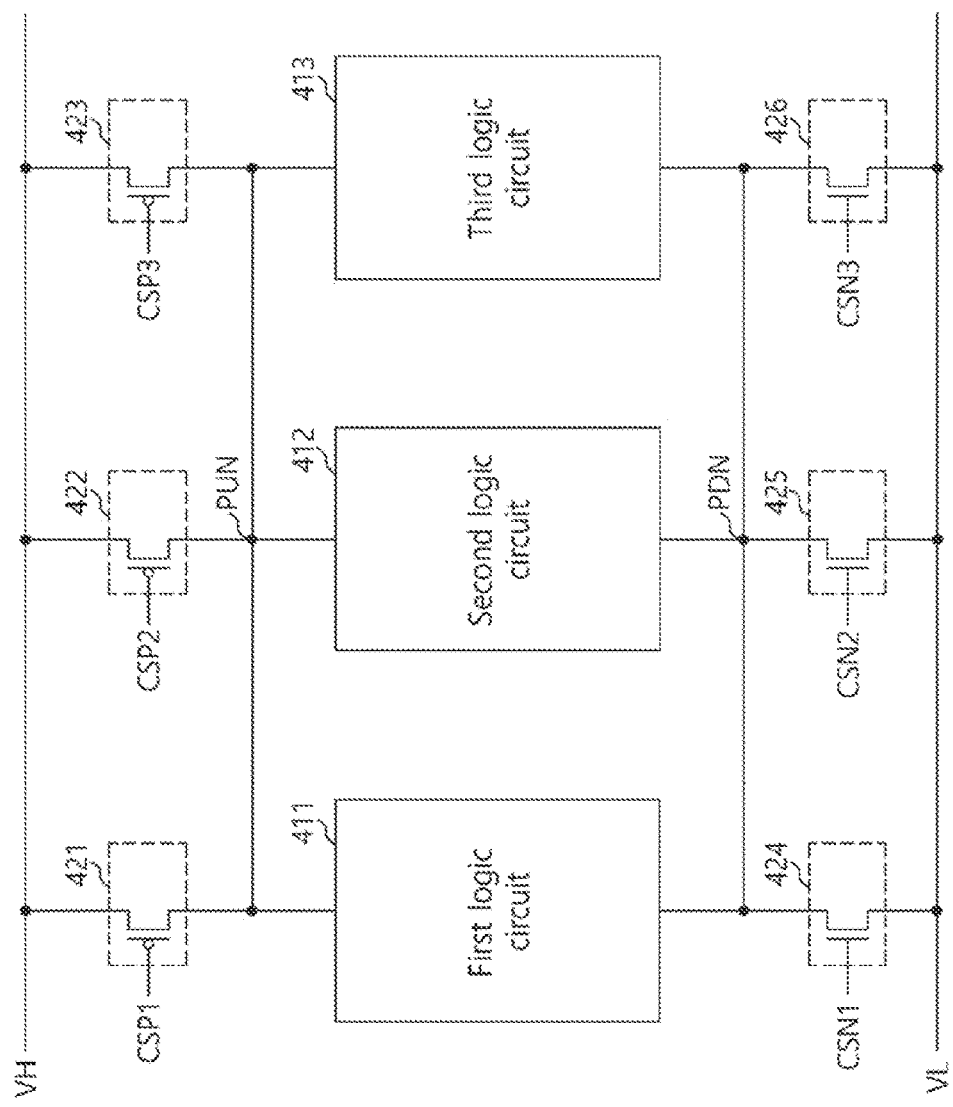

SEMICONDUCTOR APPARATUS INCLUDING POWER GATING CIRCUITS

CROSS-REFERENCES TO RELATED APPLICATION

The present application is a continuation application of U.S. patent application Ser. No. 15/957,423, filed on Apr. 19, 2018, and claims priority under 35 U.S.C. § 119(a) to Korean application number 10-2017-0132778, filed on Oct. 12, 2017, in the Korean Intellectual Property Office, which is incorporated herein by reference in its entirety.

BACKGROUND

1. Technical Field

Various embodiments generally relate to a semiconductor technology, and, more particularly, to power gating circuits and a semiconductor apparatus including the same.

2. Related Art

Electronic apparatuses may include a large number of electronic components. Among the electronic apparatuses, a computer system may include many electronic components which are manufactured by semiconductors. Semiconductor apparatuses which configure the computer system may operate by being applied with a power supply voltage. The power supply voltage may be applied from an external power source such as a power management integrated circuit. The semiconductor apparatuses may operate in various operation modes, and in general, may operate in an active mode and a standby mode. The active mode may be a mode in which the semiconductor apparatuses actually perform functions that they may perform, and the standby mode may be a sleep mode in which the semiconductor apparatuses consume minimum power. The semiconductor apparatuses may use power gating circuits to minimize power consumption in the standby mode. The power gating circuits may couple various logic circuits configuring each of the semiconductor apparatuses with terminals to be applied with the power supply voltage and thereby apply the power supply voltage to the various logic circuits, and may cut off the coupling of the power supply voltage and the logic circuits and thereby reduce power consumption in the standby mode of each of the semiconductor apparatuses. Also, the power gating circuits should have drivabilities capable of stably supplying the power supply voltage to the various logic circuits in the active mode of each of the semiconductor apparatuses.

In general, the power gating circuits may be configured by transistor elements. However, each of the transistors may have a process skew and/or variation depending on a manufacturing environment, and may have a temperature variation depending on an operating situation. Therefore, in the case where the transistors are uniformly designed and controlled, power gating efficiencies may degrade.

SUMMARY

In an embodiment, a semiconductor apparatus may be provided. The semiconductor apparatus may include a first logic circuit coupled to a first power supply voltage through a first power supply node. The semiconductor apparatus may include a second logic circuit coupled to the first power supply voltage through a second power supply node. The semiconductor apparatus may include a control logic circuit configured to monitor characteristics of the first logic circuit and the second logic circuit to selectively couple the first and second power supply nodes depending on the monitored characteristics.

In an embodiment, a semiconductor apparatus may be provided. The semiconductor apparatus may include two or more power gating circuits coupled between a first power supply voltage and a first common power node. The semiconductor apparatus may include two or more logic circuits each coupled to each other through the first common power node. The semiconductor apparatus may include a control logic circuit configured to obtain monitoring characteristics based on the logic circuits to control a number of power gating circuits used to supply the first power supply voltage to the two or more logic circuits.

In an embodiment, a semiconductor apparatus may be provided. The semiconductor apparatus may include a first logic circuit coupled to a first power supply voltage through a first power supply node. The semiconductor apparatus may include a second logic circuit coupled to the first power supply voltage through a second power supply node. The semiconductor apparatus may include a control logic circuit configured to monitor characteristics of the first logic circuit and the second logic circuit to selectively couple the first and second power supply nodes depending on the monitored characteristics.

BRIEF DESCRIPTION OF THE DRAWINGS

FIG. 4 is a diagram illustrating a representation of an example of the configuration of a semiconductor apparatus in accordance with an embodiment.

DETAILED DESCRIPTION

Hereinafter, a semiconductor apparatus including a power gating circuit will be described below with reference to the accompanying drawings through various examples of embodiments.

Various embodiments may be directed to a semiconductor apparatus capable of monitoring the characteristics of logic circuits, switching power gating circuits coupled with different logic circuits and changing the driving force of a power supply voltage to be supplied to logic circuits.

Figure 1:
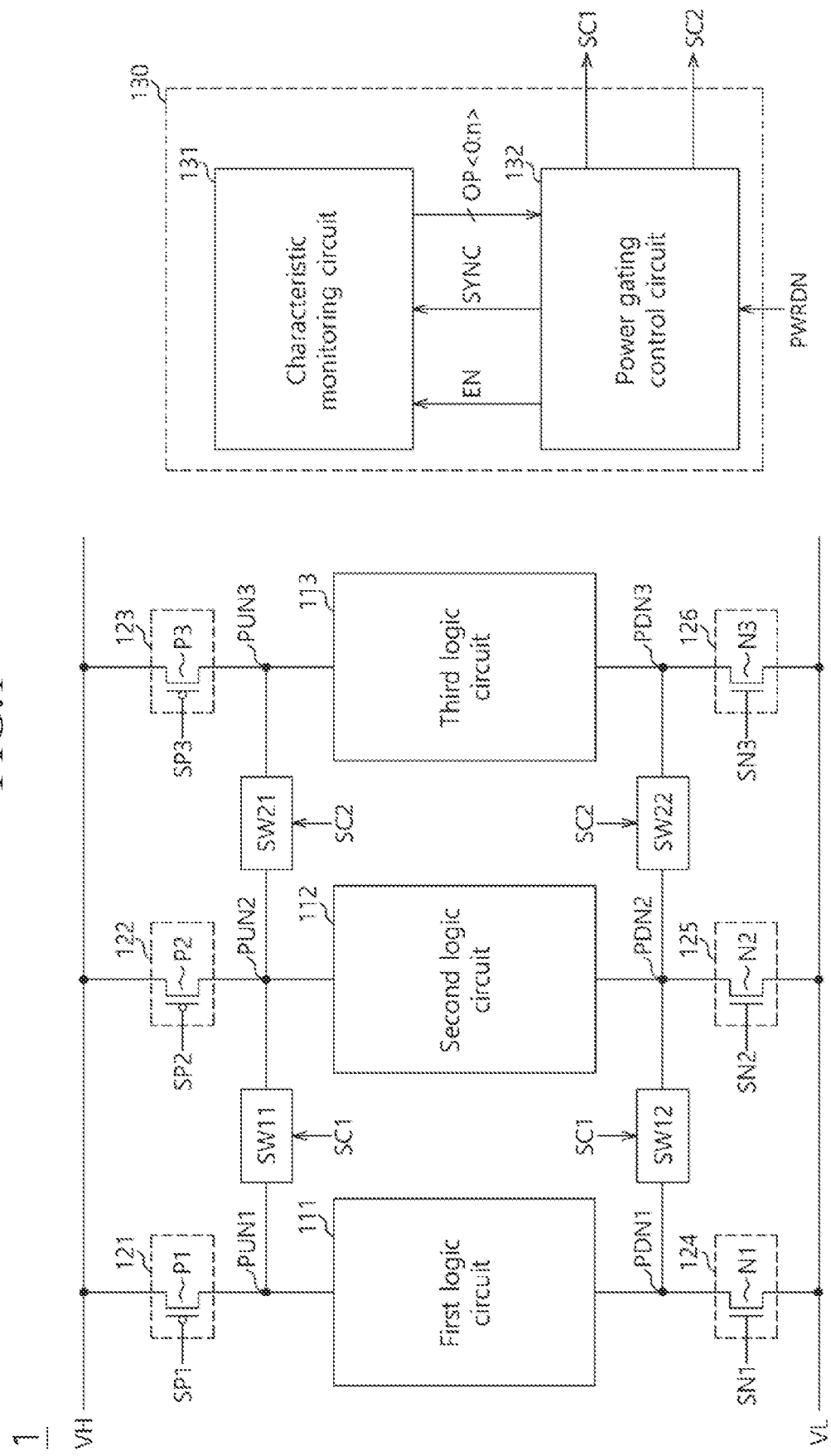
FIG. 1 is a diagram illustrating a representation of an example of the configuration of a semiconductor apparatus in accordance with an embodiment.

FIG. 1 is a diagram illustrating a representation of an example of the configuration of a semiconductor apparatus 1 in accordance with an embodiment. The semiconductor apparatus 1 may include at least two logic circuits and at least two power gating circuits. Referring FIG. 1, the semiconductor apparatus 1 will be described by way of an example including three logic circuits. The semiconductor apparatus 1 may include a first logic circuit 111, a second logic circuit 112 and a third logic circuit 113. The first to third logic circuits 111, 112 and 113 may be unspecified circuits capable of performing various functions. The first to third logic circuits 111, 112 and 113 may operate by receiving a first power supply voltage VH and a second power supply voltage VL. The first power supply voltage VH may be a high voltage, and may be, for example, an external power supply voltage applied as the operating power of the semiconductor apparatus 1 from an external power source. The second power supply voltage VL may be a low voltage having a level lower than the first power supply voltage VH, and may be, for example, a ground voltage. However, it is not intended to limit the kinds and levels of the first and second power supply voltages VH and VL, and it is to be noted that the kinds and levels of the first and second power supply voltages VH and VL may be changed depending on the kinds and functions of the first to third logic circuits 111, 112 and 113.

The semiconductor apparatus 1 may include a first power gating circuit 121, a second power gating circuit 122 and a third power gating circuit 123. The first to third power gating circuits 121, and 123 may supply the first power supply voltage VH to the first to third logic circuits 111, 112 and 113, respectively, based on the gating signals allocated thereto, respectively. The first power gating circuit 121 may supply the first power supply voltage VH to a first power supply node PUN1 based on a first gating signal SP1. The first logic circuit 111 may be coupled with the first power supply node PUN1 and receive the first power supply voltage VH. The second power gating circuit 122 may supply the first power supply voltage VH to a second power supply node PUN2 based on a second gating signal SP2. The second logic circuit 112 may be coupled with the second power supply node PUN2 and receive the first power supply voltage VH. The third power gating circuit 123 may supply the first power supply voltage VH to a third power supply node PUN3 based on a third gating signal SP3. The third logic circuit 113 may be coupled with the third power supply node PUN3 and receive the first power supply voltage VH.

The first to third power gating circuits 121, 122 and 123 may selectively supply the first power supply voltage VH depending on the operation of the semiconductor apparatus 1. For example, when the semiconductor apparatus 1 is in a standby mode, the first to third power gating circuits 121, 122 and 123 may block the first power supply voltage VH from being supplied to the first to third power supply nodes PUN1, PUN2 and PUN3, respectively, based on the first to third gating signals SP1, SP2 and SP3. When the semiconductor apparatus 1 is not in the standby mode, for example, when the semiconductor apparatus 1 is in an active mode, the first to third power gating circuits 121, 122 and 123 may supply the first power supply voltage VH to the first to third power supply nodes PUN1, PUN2 and PUN3, respectively, based on the first to third gating signals SP1, SP2 and SP3. The standby mode may mean a low power consumption mode of the semiconductor apparatus 1, and may include a sleep mode, a power-down mode, a deep power-down mode or the like. The first to third gating signals SP1, SP2 and SP3 may be disabled when the semiconductor apparatus 1 is in the standby mode and may be enabled when the semiconductor apparatus 1 is not in the standby mode.

The first power gating circuit 121 may include a first gating transistor P1. The first gating transistor P1 may be a P-channel MOS transistor. The first gating transistor P1 may apply the first power supply voltage VH to the first logic circuit 111 through the first power supply node PUN1 based on the first gating signal SP1. The first gating transistor P1 may have a gate which receives the first gating signal SP1, a source which is coupled with the terminal of the first power supply voltage VH and a drain which is coupled with the first power supply node PUN1. The second power gating circuit 122 may include a second gating transistor P2. The second gating transistor P2 may be a P-channel MOS transistor. The second gating transistor P2 may apply the first power supply voltage VH to the second logic circuit 112 through the second power supply node PUN2 based on the second gating signal SP2. The second gating transistor P2 may have a gate which receives the second gating signal SP2, a source which is coupled with the terminal of the first power supply voltage VH and a drain which is coupled with the second power supply node PUN2. The third power gating circuit 123 may include a third gating transistor P3. The third gating transistor P3 may be a P-channel MOS transistor. The third gating transistor P3 may apply the first power supply voltage VH to the third logic circuit 113 through the third power supply node PUN3 based on the third gating signal SP3. The third gating transistor P3 may have a gate which receives the third gating signal SP3, a source which is coupled with the terminal of the first power supply voltage VH and a drain which is coupled with the third power supply node PUN3.

Referring to FIG. 1, the semiconductor apparatus 1 may include at least one switching circuit. The semiconductor apparatus 1 may include a first switching circuit SW11, a second switching circuit SW21 and a control logic circuit 130. The first switching circuit SW11 may couple the first power supply node PUN1 and the second power supply node PUN2 based on a first switching control signal SC1. The first switching circuit SW11 may be turned on and couple the first and second power supply nodes PUN1 and PUN2 when the first switching control signal SC1 is enabled. The first switching circuit SW11 may be turned off and decouple the first and second power supply nodes PUN1 and PUN2 when the first switching control signal SC1 is disabled. The second switching circuit SW21 may couple the second power supply node PUN2 and the third power supply node PUN3 based on a second switching control signal SC2. The second switching circuit SW21 may be turned on and couple the second and third power supply nodes PUN2 and PUN3 when the second switching control signal SC2 is enabled. The second switching circuit SW21 may be turned off and decouple the second and third power supply nodes PUN2 and PUN3 when the second switching control signal SC2 is disabled.

The control logic circuit 130 may monitor the characteristics of the first to third logic circuits 111, 112 and 113, and may generate the first and second switching control signals SC1 and SC2 based on monitoring results. The characteristics of the first to third logic circuits 111, 112 and 113 may include process and/or temperature variations. A process variation may mean the process skew of a logic circuit. In the case where the process variation of a logic circuit is faster than a reference, the logic circuit may be able to operate normally, even if a power supply voltage of a relatively low or high level (a relatively low level in the case of the first power supply voltage VH or a relatively high level in the case of the second power supply voltage VL) is received. Therefore, the driving force of a power gating circuit coupled with a logic circuit of which process variation is faster than the reference may be relatively small. Conversely, in the case where the process variation of a logic circuit is slower than the reference, the logic circuit may be able to operate normally, only when a power supply voltage of a relatively high or low level (a relatively high level in the case of the first power supply voltage VH or a relatively low level in the case of the second power supply voltage VL) is received. Therefore, the driving force of a power gating circuit coupled with a logic circuit of which process variation is slower than the reference may be relatively large. A temperature variation may mean a temperature deviation of a logic circuit. In the case where the temperature of a logic circuit is higher than a reference, the logic circuit may be able to operate normally, even if a power supply voltage of a relatively low level is received. In the case where the temperature of a logic circuit is lower than the reference, the logic circuit may be able to operate normally, only when a power supply voltage of a relatively high level is received. In general, because a temperature at which a semiconductor apparatus operates is related with the mobility of a transistor, a logic circuit may operate fast as the temperature at which the semiconductor apparatus operates is low, and may operate slow as the temperature at which the semiconductor apparatus operates is high. However, recently, as the line width (design rule) of a semiconductor apparatus shrinks, the level of the threshold voltage of a transistor is being lowered. In this regard, a temperature may change the level of the threshold voltage of a transistor. Thus, a logic circuit may operate fast as a temperature at which a semiconductor apparatus operates is high, and may operate slow as a temperature at which a semiconductor apparatus operates is low.

Hence, the driving force of a power gating circuit coupled with a logic circuit of which process variation is faster than the reference or which operates at a relatively high temperature may be relatively small, and the driving force of a power gating circuit coupled with a logic circuit of which process variation is slower than the reference or which operates at a relatively low temperature should be relatively large. Nevertheless, it is the norm that the transistor elements of the power gating circuits disposed in a single semiconductor apparatus are designed and manufactured in the same manner. Further, it is actually impossible to figure out in advance the characteristics of logic circuits and differently design transistor elements in conformity with the characteristics of the logic circuits.

In an embodiment, the control logic circuit 130 may monitor the characteristics of the first to third logic circuits 111, 112 and 113, and may selectively couple the first to third power supply nodes PUN1, PUN2 and PUN3 depending on monitoring results. For example, it is assumed that the process variations of the first and second logic circuits 111 and 112 are slower than the reference and the process variation of the third logic circuit 113 is faster than the reference. The control logic circuit 130 may enable the first switching control signal SC1 and disable the second switching control signal SC2. Accordingly, since the first and second power gating circuits 121 and 122 supply together the first power supply voltage VH to the first and second power supply nodes PUN1 and PUN2, the first power supply voltage VH may be supplied to the first and second power supply nodes PUN1 and PUN2 with a relatively large driving force. The third logic circuit 113 may be supplied with the first power supply voltage VH through the third power supply node PUN3 by only the third power gating circuit 123. Accordingly, the third logic circuit 113 may receive the first power supply voltage VH with a relatively small driving force. The control logic circuit 130 may generate the first and second switching control signals SC1 and SC2, and thereby, may control the first to third logic circuits 111, 112 and 113 to operate by receiving power supply voltages having optimal levels and/or driving forces.

Referring to FIG. 1, the semiconductor apparatus 1 may further include a fourth power gating circuit 124, a fifth power gating circuit 125, a sixth power gating circuit 126, a third switching circuit SW12 and a fourth switching circuit SW22. The fourth to sixth power gating circuits 124, 125 and 126 may supply the second power supply voltage VL to the first to third logic circuits 111, 112 and 113, respectively, based on the gating signals allocated thereto, respectively. The fourth power gating circuit 124 may supply the second power supply voltage VL to the first logic circuit 111 through a fourth power supply node PDN1 based on a fourth gating signal SN1. The first logic circuit 111 may be coupled with the fourth power supply node PDN1 and receive the second power supply voltage VL. The fifth power gating circuit 125 may supply the second power supply voltage VL to the second logic circuit 112 through a fifth power supply node PDN2 based on a fifth gating signal SN2. The second logic circuit 112 may be coupled with the fifth power supply node PDN2 and receive the second power supply voltage VL. The sixth power gating circuit 126 may supply the second power supply voltage VL to the third logic circuit 113 through a sixth power supply node PDN3 based on a sixth gating signal SN3. The third logic circuit 113 may be coupled with the sixth power supply node PDN3 and receive the second power supply voltage VL. The fourth gating signal SN1 may be the inverted signal of the first gating signal SP1, the fifth gating signal SN2 may be the inverted signal of the second gating signal SP2, and the sixth gating signal SN3 may be the inverted signal of the third gating signal SP3.

The fourth power gating circuit 124 may include a fourth gating transistor N1. The fourth gating transistor N1 may be an N-channel MOS transistor. The fourth gating transistor N1 may have a gate which receives the fourth gating signal SN1, a drain which is coupled with the fourth power supply node PDN1 and a source which is coupled with the terminal of the second power supply voltage VL. The fifth power gating circuit 125 may include a fifth gating transistor N2. The fifth gating transistor N2 may be an N-channel MOS transistor. The fifth gating transistor N2 may have a gate which receives the fifth gating signal SN2, a drain which is coupled with the fifth power supply node PDN2 and a source which is coupled with the terminal of the second power supply voltage VL. The sixth power gating circuit 126 may include a sixth gating transistor N3. The sixth gating transistor N3 may be an N-channel MOS transistor. The sixth gating transistor N3 may have a gate which receives the sixth gating signal SN3, a drain which is coupled with the sixth power supply node PDN3 and a source which is coupled with the terminal of the second power supply voltage VL.

The third switching circuit SW12 may couple the fourth and fifth power supply nodes PDN1 and PDN2 based on the first switching control signal SC1. The third switching circuit SW12 may be turned on and couple the fourth and fifth power supply nodes PDN1 and PDN2 when the first switching control signal SC1 is enabled. The third switching circuit SW12 may be turned off and decouple the fourth and fifth power supply nodes PDN1 and PDN2 when the first switching control signal SC1 is disabled. The fourth switching circuit SW22 may couple the fifth and sixth power supply nodes PDN2 and PDN3 based on the second switching control signal SC2. The fourth switching circuit SW22 may be turned on and couple the fifth and sixth power supply nodes PDN2 and PDN3 when the second switching control signal SC2 is enabled. The fourth switching circuit SW22 may be turned off and decouple the fifth and sixth power supply nodes PDN2 and PDN3 when the second switching control signal SC2 is disabled. For example, it is assumed that the process variations of the first and second logic circuits 111 and 112 are slower than the reference and the process variation of the third logic circuit 113 is faster than the reference. The control logic circuit 130 may enable the first switching control signal SC1 and disable the second switching control signal SC2. Accordingly, since the fourth and fifth power gating circuits 124 and 125 supply together the second power supply voltage VL to the fourth and fifth power supply nodes PDN1 and PDN2, the second power supply voltage VL may be supplied to the fourth and fifth power supply nodes PDN1 and PDN2 with a relatively large driving force. The third logic circuit 113 may be supplied with the second power supply voltage VL through the sixth power supply node PDN3 by only the sixth power gating circuit 126. Accordingly, the third logic circuit 113 may receive the second power supply voltage VL with a relatively small driving force.

The control logic circuit 130 may include a characteristic monitoring circuit 131 and a power gating control circuit 132. The characteristic monitoring circuit 131 may monitor the characteristics of the first to third logic circuits 111, 112 and 113 and generate a characteristic information OP<0:n>. The characteristic monitoring circuit 131 may include a delay line which copies at least one among the first to third logic circuits 111, 112 and 113. The delay line which copies the logic circuit may include transistor elements which are manufactured at substantially the same environment and/or condition as transistor elements configuring the logic circuit. The characteristic monitoring circuit 131 may monitor the characteristic of the logic circuit related with a process and/or temperature variation through the delay line which copies the logic circuit, and may generate the characteristic information OP<0:n> based on a monitoring result. The characteristic monitoring circuit 131 may receive an enable signal EN. The characteristic monitoring circuit 131 may monitor the characteristic of the logic circuit by being activated when the enable signal EN which is enabled is received. Also, the characteristic monitoring circuit 131 may further receive a synthesized code SYNC. The logic circuit may include a plurality of unspecified circuits for performing various functions. When the semiconductor apparatus 1 is a memory apparatus, the logic circuit may include circuits such as a data path, a clock path, a command path and an address path. The data path may include any circuit which processes data, and the clock path may include any circuit which processes a clock signal. Similarly, the command path and the address path may include any circuits which process a command signal and an address signal, respectively. Since the various signal paths may perform different logic calculations and have different structures, they may have different delay amounts. The delay line of the characteristic monitoring circuit 131 may be a variable delay line, and may be changed in its delay amount based on the synthesized code SYNC to be able to replicate the various signal paths.

The power gating control circuit 132 may generate the first and second switching control signals SC1 and SC2 based on a power-down signal PWRDN and the characteristic information OP<0:n>. The power-down signal PWRDN as a signal which instructs the semiconductor apparatus 1 to enter the standby mode may be a signal which may be inputted from an external device of the semiconductor apparatus 1. The power gating control circuit 132 may disable both the first and second switching control signals SC1 and SC2 when the semiconductor apparatus 1 is in the standby mode. When the semiconductor apparatus 1 is not in the standby mode, the power gating control circuit 132 may selectively enable the first and second switching control signals SC1 and SC2 based on the characteristic information OP<0:n>. The power gating control circuit 132 may disable both the first and second switching control signals SC1 and SC2 in the power-up period of the semiconductor apparatus 1. The power-up period may mean a period in which the level of a power supply voltage is stabilized when the semiconductor apparatus exits the standby mode and enters the active mode. If the semiconductor apparatus 1 enters the active mode, the semiconductor apparatus 1 is applied with the first and second power supply voltages VH and VL from external power sources, and, as the first and second power supply voltages VH and VL are applied, the voltage levels of the first to sixth power supply nodes PUN1, PUN2, PUN3, PDN1, PDN2 and PDN3 may be changed. In order for the stable operation of the semiconductor apparatus 1, a time for the first to third power supply nodes PUN1, PUN2 and PUN3 to be settled to the level of the first power supply voltage VH should be secured, and a time for the forth to sixth power supply nodes PDN1, PDN2 and PDN3 to be settled to the level of the second power supply voltage VL should be secured. Therefore, the power gating control circuit 132 may disable the first and second switching control signals SC1 and SC2 such that the voltage levels of the first to sixth power supply nodes PUN1, PUN2, PUN3, PDN1, PDN2 and PDN3 are stably settled by the first to sixth power gating circuits 121, 122, 123, 124, 125 and 126.

Figure 2:
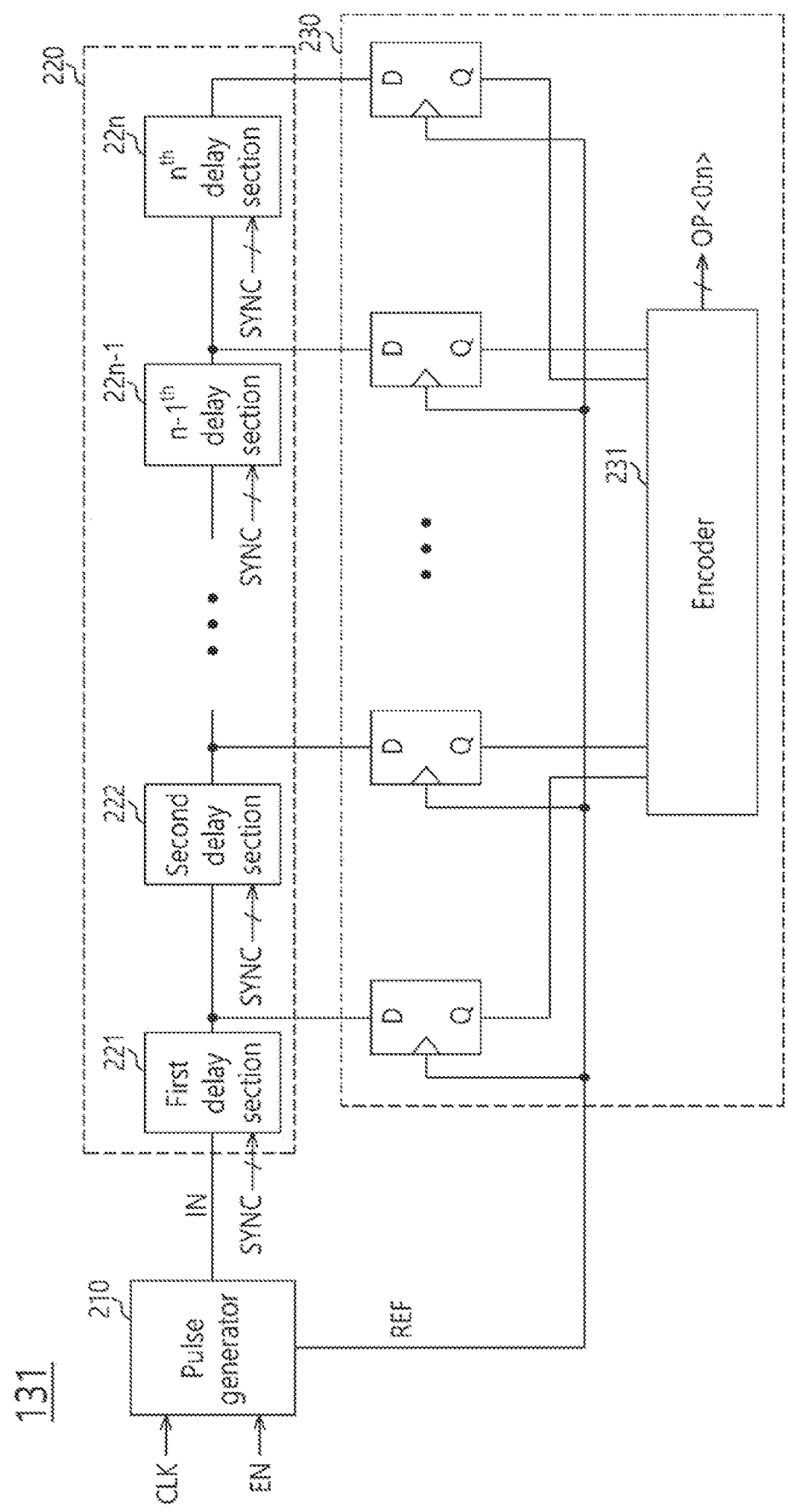
FIG. 2 is a diagram illustrating a representation of an example of the configuration of the characteristic monitoring circuit illustrated in FIG. 1.

FIG. 2 is a diagram illustrating a representation of an example of the configuration of the characteristic monitoring circuit illustrated in FIG. 1. Referring to FIG. 2, only the configuration of the characteristic monitoring circuit 131 for monitoring the characteristic of one logic circuit may be illustrated, and the characteristic monitoring circuit 131 may include a plurality of configurations the same as the configuration illustrated in FIG. 2 in correspondence to the number of logic circuits. In an embodiment, the characteristic monitoring circuit 131 may include only the configuration illustrated in FIG. 2, and may sequentially monitor the characteristics of a plurality of logic circuits by changing a synthesized code. The characteristic monitoring circuit 131 may include a pulse generator 210, a delay line 220 and a characteristic information generator 230. The pulse generator 210 may receive a clock signal CLK. The pulse generator 210 may generate a level signal IN and a reference signal REF based on the clock signal CLK. The level signal IN may be a signal which retains a state enabled to, for example but not limited to, a high level, based on the clock signal CLK. The reference signal REF may be a pulse signal which is enabled after a predetermined time from a point of time when the clock signal CLK is received. For example, the reference signal REF may be enabled after a predetermined number of cycles of the clock signal CLK. The semiconductor apparatus 1 may be changed in its operation speed based on the clock signal CLK. For example, the semiconductor apparatus 1 may operate with a first frequency by receiving the clock signal CLK having a high frequency, and may operate with a second frequency lower than the first frequency by receiving the clock signal CLK having a low frequency. The pulse generator 210 may receive the enable signal EN. The pulse generator 210 may generate and output the level signal IN and the reference signal REF based on the clock signal CLK when the enable signal EN is enabled.

The delay line 220 may receive the level signal IN. The delay line 220 may include a plurality of delay sections. The plurality of delay sections may be coupled in series, and may sequentially delay the level signal IN. The delay line 220 may include first to n^th delay sections 221, 222, . . . , 22n-1, 22n. The first delay section 221 may delay the level signal IN and output an output. Each of the second to n^th delay sections 222, . . . , 22n-1, 22n may delay the output of a delay section of a previous stage and output an output. For example, the first to n^th delay sections 221, 222, . . . , 22n−1, 22n may have the same configuration. In an embodiment, the first to n^th delay sections 221, 222, . . . , 22n−1, 22n may be variable delay sections. Each of the first to n^th delay sections 221, 222, . . . , 22n−1, 22n may be changed in its delay amount by receiving the synthesized code SYNC.

The characteristic information generator 230 may be coupled with the output terminals of the plurality of delay sections, and may generate the characteristic information OP<0:n> based on the signals outputted from the plurality of delay sections. The characteristic information generator 230 may receive the signals outputted from the plurality of delay sections when the reference signal REF is enabled, and may generate the characteristic information OP<0:n> based on the received signals. The characteristic information generator 230 may include a plurality of flip-flops. The input terminals of the plurality of flip-flops may be coupled with the output terminals of the first to n^th delay sections 221, 222, . . . , 22n−1, 22n, respectively, and may receive the signals outputted from the first to n^th delay sections 221, 222, . . . , 22n−1, 22n. The clock terminals of the plurality of flip-flops may receive the reference signal REF. The plurality of flip-flops may be DQ flip-flops. The plurality of flip-flops may output the signals outputted from the first to n^th delay sections 221, 222, . . . , 22n−1, 22n, through the output terminals thereof when the reference signal REF is enabled. The signals outputted through the output terminals of the plurality of flip-flops may be provided as the characteristic information OP<0:n>. The characteristic information generator 230 may further include an encoder 231. The encoder 231 may receive the signals outputted from the plurality of flip-flops, encode the received signals and generate the characteristic information OP<0:n>. The encoder 231 may be an optional component, and may be provided to specify the number of bits of the signal configuring the characteristic information OP<0:n>.

The first to n^th delay sections 221, 222, . . . , 22n−1, 22n may be configured by imitating and/or replicating at least one of the first to third logic circuits 111, 112 and 113. Therefore, the delay line may have substantially the same characteristic as the logic circuit. As the process variation of the logic circuit is faster than the reference, the delay amount of the delay line 220 may be decreased. Conversely, as the process variation of the logic circuit is slower than the reference, the delay amount of the delay line 220 may be increased. Further, the delay amount of the delay line 220 may be changed based on a temperature at which the logic circuit operates. The semiconductor apparatus 1 may be changed in its operation speed depending on a temperature. The delay amount of the delay line 220 may be a delay amount that is changed depending on a temperature at which the logic circuit operates. When the logic circuit operates fast based on a process and/or temperature variation, the level signal IN may reach the n^th delay section 22n until the reference signal REF is enabled, and, when the reference signal REF is enabled, the plurality of flip-flops may output output signals all of which have a logic high level. Therefore, the characteristic information OP<0:n> may have the logic value of "1, 1, 1, . . . , 1, 1, 1, 1." Conversely, when the logic circuit operates slow based on a process and/or temperature variation, the level signal IN may not reach the n^th delay section 22n until the reference signal REF is enabled. When the reference signal REF is enabled, some flip-flops may generate output signals which have a logic low level, and the characteristic information OP<0:n> may have the logic value of, for example, "1, 1, 1, . . . , 0, 0, 0, 0." Also, when the logic circuit operates at a speed between the above two cases based on a process and/or temperature variation, the characteristic information OP<0:n> may have a value between the above two logic values. As a consequence, the characteristic monitoring circuit 131 may monitor the process and temperature variations of the first to third logic circuits 111, 112 and 113, and may generate the characteristic information OP<0:n> depending on the characteristics of the first to third logic circuits 111, 112 and 113.

Figure 3:
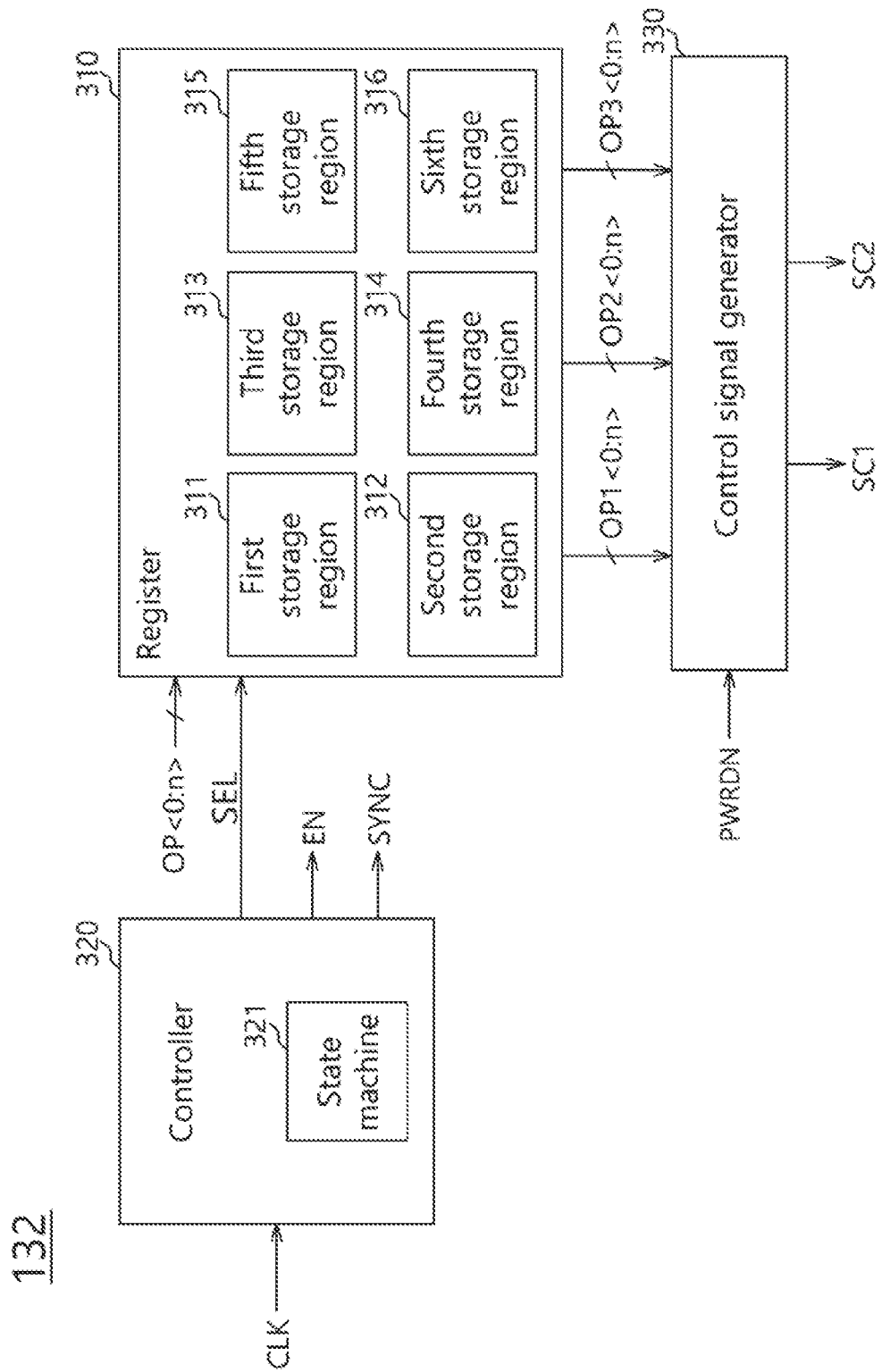
FIG. 3 is a diagram illustrating a representation of an example of the configuration of the power gating control circuit illustrated in FIG. 1.

FIG. 3 is a diagram illustrating a representation of an example of the configuration of the power gating control circuit 132 illustrated in FIG. 1. Referring to FIG. 3, the power gating control circuit 132 may include a register 310, a controller 320 and a control signal generator 330. The register 310 may store the characteristic information OP<0:n> generated from the characteristic monitoring circuit 131. Referring to FIG. 3, the characteristic information related with the first logic circuit 111 is denoted as OP1<0:n>, and the characteristic information related with the second logic circuit 112 is denoted as OP2<0:n>, and the characteristic information related with the third logic circuit 113 is denoted as OP3<0:n>. The register 310 may include a first storage region 311 and a second storage region 312. For example, the first storage region 311 may store the characteristic information OP1<0:n> when the first logic circuit 111 operates with a first frequency. The second storage region 312 may store the characteristic information OP1<0:n> when the first logic circuit 111 operates with a second frequency. The characteristic information stored in the first storage region 311 may be fast mode characteristic information. The characteristic information stored in the second storage region 312 may be slow mode characteristic information. The characteristic information OP1<0:n> stored in the first and second storage regions 311 and 312 may be updated each time the characteristic monitoring circuit 131 performs a monitoring operation. The register 310 may further include third to sixth storage regions 313, 314, 315 and 316. The third storage region 313 may store the fast mode characteristic information of the second logic circuit 112, and the fourth storage region 314 may store the slow mode characteristic information of the second logic circuit 112. The fifth storage region 315 may store the fast mode characteristic information of the third logic circuit 113, and the sixth storage region may store the slow mode characteristic information of the third logic circuit 113.

The controller 320 may generate the enable signal EN, the synthesized code SYNC and a characteristic information select signal SEL. The controller 320 may enable the enable signal EN when the semiconductor apparatus 1 is booted up and/or powered up. The controller 320 may cyclically enable the enable signal EN after the semiconductor apparatus 1 is booted up and/or powered up. The controller 320 may include a state machine 321. The state machine may store information for imitating and/or replicating the various signal paths of the first to third logic circuits 111, 112 and 113, and may generate the synthesized code SYNC based on the information. The controller 320 may receive the clock signal CLK. The controller may determine the operation speed of the semiconductor apparatus 1 by receiving the clock signal CLK. The controller 320 may generate the characteristic information select signal SEL based on a determination result, and thereby, may access a desired storage region among the first to sixth storage regions 311, 312, 313, 314, and 316 of the register 310. The first to sixth storage regions 311, 312, 313, 314, 315 and 316 may output the characteristic information stored therein to the control signal generator 330 based on the characteristic information select signal SEL. The control signal generator 330 may receive the characteristic information OP1<0:n>, OP2<0:n> and OP3<0:n>, decode the characteristic information OP1<0:n>, OP2<0:n> and OP3<0:n>, and generate the first and second switching control signals SC1 and SC2. The control signal generator 330 may receive the power-down signal PWRDN. The control signal generator 330 may disable the first and second switching control signals SC1 and SC2 based on the power-down signal PWRDN.

FIG. 4 is a diagram illustrating a representation of an example of the configuration of a semiconductor apparatus 4 in accordance with an embodiment. Referring to FIG. 4, the semiconductor apparatus 4 may have a configuration similar to that of the semiconductor apparatus 1 illustrated in FIG. 1, and repeated descriptions for the same components will be omitted herein. Referring to FIG. 4, the semiconductor apparatus 4 may include at least two logic circuits and at least two power gating circuits. The semiconductor apparatus 4 may include a first logic circuit 411, a second logic circuit 412, a third logic circuit 413, a first power gating circuit 421, a second power gating circuit 422, a third power gating circuit 423, a fourth power gating circuit 424, a fifth power gating circuit 425 and a sixth power gating circuit 426. The first to third logic circuits 411, 412 and 413 may be coupled in common with a first common power node PUN and a second common power node PDN. The first power gating circuit 421 may apply a first power supply voltage VH to the first common power node PUN based on a first control gating signal CSP1. The second power gating circuit 422 may apply the first power supply voltage VH to the first common power node PUN based on a second control gating signal CSP2. The third power gating circuit 423 may apply the first power supply voltage VH to the first common power node PUN based on a third control gating signal CSP3. The fourth power gating circuit 424 may apply a second power supply voltage VL to the second common power node PDN based on a fourth control gating signal CSN1. The fifth power gating circuit 425 may apply the second power supply voltage VL to the second common power node PDN based on a fifth control gating signal CSN2. The sixth power gating circuit 426 may apply the second power supply voltage VL to the second common power node PDN based on a sixth control gating signal CSN3. The fourth control gating signal CSN1 may be the inverted signal of the first control gating signal CSP1, the fifth control gating signal CSN2 may be the inverted signal of the second control gating signal CSP2, and the sixth control gating signal CSN3 may be the inverted signal of the third control gating signal CSP3.

The semiconductor apparatus 4 may include a control logic circuit 430. The control logic circuit 430 may monitor the characteristics of the first to third logic circuits 411, 412 and 413, and may generate the first to sixth control gating signals CSP1, CSP2, CSP3, CSN1, CSN2 and CSN3 based on an operation state of the semiconductor apparatus 4 and a result of monitoring the characteristics of the first to third logic circuits 411, 412 and 413. The control logic circuit 430 may generate the first to sixth control gating signals CSP1, CSP2, CSP3, CSN1, CSN2 and CSN3 based on a power-down signal PWRDN and the result of monitoring the characteristics of the first to third logic circuits 411, 412 and 413.

The control logic circuit 430 may include a characteristic monitoring circuit 431 and a power gating control circuit 432. The characteristic monitoring circuit 431 may monitor the characteristics of the first to third logic circuits 411, 412 and 413 and generate a characteristic information OP<0:n>. The characteristic monitoring circuit 431 may be activated by receiving an enable signal EN and monitor the characteristics of the first to third logic circuits 411, 412 and 413. The characteristic monitoring circuit 431 may replicate the various signal paths of the first to third logic circuits 411, 412 and 413 by receiving a synthesized code SYNC. The power gating control circuit 432 may provide the enable signal EN and the synthesized code SYNC to the characteristic monitoring circuit 431, and may generate the first to sixth control gating signals CSP1, CSP2, CSP3, CSN1, CSN2 and CSN3 based on the power-down signal PWRDN and the characteristic information OP<0:n>.

The characteristic monitoring circuit 431 may have substantially the same structure as the characteristic monitoring circuit 131 illustrated in FIG. 2. The power gating control circuit 432 may have a structure similar to that of the power gating control circuit 132 illustrated in FIG. 3, but may perform a different calculation operation from the control signal generator 230. The first to sixth control gating signals CSP1, CSP2, CSP3, CSN1, CSN2 and CSN3 may be signals in which the characteristics of the first to sixth gating signals SP1, SP2, SP3, SN1, SN2 and SN3 and the first and second switching control signals SC1 and SC2 are integrated. For example, if the process and temperature variations of the first to third logic circuits 411, 412 and 413 are faster and higher than references, the first to third logic circuits 411, 412 and 413 may operate at a highest speed. Therefore, the first to third logic circuits 411, 412 and 413 may be able to operate normally, even if a power supply voltage of a relatively low or high level (a relatively low level in the case of the first power supply voltage VH or a relatively high level in the case of the second power supply voltage VL) is received. The power gating control circuit 432 may disable the first to sixth control gating signals CSP1, CSP2, CSP3, CSN1, CSN2 and CSN3 regardless of the characteristic information OP<0:n> when the power-down signal PWRDN is enabled. The power gating control circuit 432 may enable any one of the first to third control gating signals CSP1, CSP2 and CSP3 based on the characteristic information OP<0:n> when the power-down signal PWRDN is disabled. Therefore, the first to third logic circuits 411, 412 and 413 may receive the first power supply voltage VH through any one of the first to third power gating circuits 421, 422 and 423. When the first control gating signal CSP1 is enabled and the first power gating circuit 421 applies the first power supply voltage VH, the fourth control gating signal CSN1 may be enabled and the fourth power gating circuit 424 may apply the second power supply voltage VL to the first to third logic circuits 411, 412 and 413.

If the process and temperature variations of the first to third logic circuits 411, 412 and 413 are slower and lower than the references, the first to third logic circuits 411, 412 and 413 may operate at a lowest speed. Therefore, the first to third logic circuits 411, 412 and 413 may be able to operate normally, only when a power supply voltage of a relatively high or low level (a relatively high level in the case of the first power supply voltage VH or a relatively low level in the case of the second power supply voltage VL) is received. The power gating control circuit 432 may enable all of the first to third control gating signals CSP1, CSP2 and CSP3 based on the characteristic information OP<0:n> when the semiconductor apparatus 4 is not in a standby mode. The first to third logic circuits 411, 412 and 413 may be applied with the first power supply voltage VH through the first to third power gating circuits 421, 422 and 423 and may be applied with the second power supply voltage VL through the fourth to sixth power gating circuits 424, 425 and 426.

When the process and temperature variations of the first to third logic circuits 411, 412 and 413 are faster and lower than the references or slower and higher than the references, the first to third logic circuits 411, 412 and 413 may operate at an intermediate speed between the highest speed and the lowest speed. Thus, the power gating control circuit 432 may enable two among the first to third control gating signals CSP1, CSP2 and CSP3, and the first to third logic circuits 411, 412 and 413 may receive the first power supply voltage VH through two power gating circuits. Similarly, two of the fourth to sixth control gating signals CSN1, CSN2 and CSN3 may be enabled, and the first to third logic circuits 411, 412 and 413 may receive the second power supply voltage VL through two power gating circuits.

While various embodiments have been described above, it will be understood to those skilled in the art that the embodiments described are examples only. Accordingly, the semiconductor apparatus including a power gating circuit described herein should not be limited based on the described embodiments.

What is claimed is:

1. A semiconductor apparatus comprising:
   a first logic circuit coupled with a first common power node;
   a second logic circuit coupled with the first common power node;
   a first power gating circuit configured to supply a first power supply voltage to the first common power node based on a first control gating signal;
   a second power gating circuit configured to supply the first power supply voltage to the first common power node based on a second control gating signal; and
   a control logic circuit configured to generate the first and second control gating signals based on a power-down signal and a result of monitoring characteristics of the first and second logic circuits, and to selectively enable the first and second control gating signals based on the result of monitoring the characteristics of the first and second logic circuits when the power-down signal is disabled.

2. The semiconductor apparatus according to claim 1, wherein the control logic circuit disables the first and second control gating signals when the power-down signal is enabled.

3. The semiconductor apparatus according to claim 1, further comprising:
   a third logic circuit coupled with the first common power node; and
   a third power gating circuit configured to supply the first power supply voltage to the first common power node based on a third control gating signal,
   wherein the control logic circuit additionally monitors a characteristic of the third logic circuit, and generates the third control gating signal based on the power-down signal and a result of monitoring the characteristics of the first to third logic circuits.

4. A semiconductor apparatus comprising:
   a first logic circuit coupled with a first common power node and a second common power node;
   a second logic circuit coupled with the first common power node and the second common power node;
   a first power gating circuit configured to supply a first power supply voltage to the first common power node based on a first control gating signal;
   a second power gating circuit configured to supply the first power supply voltage to the first common power node based on a second control gating signal;
   a third power gating circuit configured to supply a second power supply voltage to the second common power node based on a third control gating signal;
   a fourth power gating circuit configured to supply the second power supply voltage to the second common power node based on a fourth control gating signal; and
   a control logic circuit configured to generate the first to fourth control gating signals based on a power-down signal and characteristic information of the first and second logic circuits, and to disable the first to fourth control gating signals regardless of the characteristic information, when the power-down signal is enabled.

5. The semiconductor apparatus according to claim 4, wherein the control logic circuit selectively enables at least one of the first and second control gating signals and at least one of the third and fourth control gating signals based on the characteristic information, when the power-down signal is disabled.

6. The semiconductor apparatus according to claim 4, wherein the control logic circuit monitors process and temperature variation of the first and second logic circuits to generate the characteristic information.

7. The semiconductor apparatus according to claim 4, wherein the control logic circuit comprises:
   a characteristic monitoring circuit configured to monitor the characteristics of the first and second logic circuit and generate the characteristic information; and
   a power gating control circuit configured to generate the first to fourth control gating signals based on the power-down signal and the characteristic information.

8. The semiconductor apparatus according to claim 4, further comprising:
   a third logic circuit coupled with the first common power node and the second common power node;
   a fifth power gating circuit configured to supply the first power supply voltage to the first common power node based on a fifth control gating signal; and
   a sixth power gating circuit configured to supply the second power supply voltage to the second common power node based on a sixth control gating signal,
   wherein the control logic circuit additionally generates the third control gating signal based on the power-down signal and characteristic information of the first to third logic circuits.

9. A semiconductor apparatus comprising:
   a first logic circuit coupled with a first common power node;
   a second logic circuit coupled with the first common power node;
   a first power gating circuit configured to supply a first power supply voltage to the first common power node based on a first control gating signal;
   a second power gating circuit configured to supply the first power supply voltage to the first common power node based on a second control gating signal; and
   a control logic circuit configured to generate the first and second control gating signals based on a power-down signal and characteristic information of the first and second logic circuits, and to disable the first and second control gating signals regardless of the characteristic information when the power-down signal is enabled.

10. The semiconductor apparatus according to claim 9, wherein the control logic circuit selectively enables at least one of the first and second control gating signals based on the characteristic information when the power-down signal is disabled.

* * * * *